United States Patent [19]

Banks et al.

[11] Patent Number: 4,537,498

[45] Date of Patent: Aug. 27, 1985

[54] FOCAL PLANE ADJUSTED PHOTOMASK AND METHODS OF PROJECTING IMAGES ONTO PHOTOSENSITIZED WORKPIECE SURFACES

[75] Inventors: Edward L. Banks, Allentown; Thomas S. Ellington, IV, Emmaus; Terrence E. Zavecz, Alburtis, all of Pa.

[73] Assignee: AT&T Technologies, Inc., New York, N.Y.

[21] Appl. No.: 606,561

[22] Filed: May 3, 1984

[51] Int. Cl.³ ............................................. G03B 27/52
[52] U.S. Cl. ......................................... 355/55; 355/53
[58] Field of Search .............................. 355/53, 55, 40

[56] References Cited

U.S. PATENT DOCUMENTS

| | | | |
|---|---|---|---|
| 3,951,701 | 4/1976 | Csillag | 148/187 |
| 4,063,812 | 12/1977 | Abraham et al. | 355/18 |
| 4,361,643 | 11/1982 | Banks et al. | 430/396 |
| 4,379,831 | 4/1983 | Loebach | 430/311 |
| 4,390,273 | 6/1983 | Loebach | 355/125 |

FOREIGN PATENT DOCUMENTS 2845147 1/1980 Fed. Rep. of Germany .
2036367 6/1980 United Kingdom .

*Primary Examiner*—Monroe H. Hayes
*Attorney, Agent, or Firm*—W. O. Schellin; G. W. Houseweart

[57] ABSTRACT

In the operation of a projection printer (11) photomasks (22), the patterns (21) of which are protected by coverplates (39), are used interchangeably with other photomasks, the patterns of which are located at an open surface thereof. The photomasks (22) feature shims (46) which space the patterns (21) away from a plane of support surfaces (13) of a mounting chuck (12) by a precise distance equal to the shift of the object plane (14) with respect to an image plane (17) because of the presence of the coverplate (39) in the optical path of the projection printer (11).

11 Claims, 4 Drawing Figures

FOCAL PLANE ADJUSTED PHOTOMASK AND METHODS OF PROJECTING IMAGES ONTO PHOTOSENSITIZED WORKPIECE SURFACES

TECHNICAL FIELD

The present invention relates to a photomask structure for use in photo-imaging apparatus and to methods of projecting images from a photomask onto photosensitized surfaces. The invention relates particularly to a photomask structure for use in high resolution photo-imaging apparatus. An example of such apparatus is a projection printer used in photolithographic processing steps in the fabrication of semiconductor integrated circuits.

BACKGROUND OF THE INVENTION

A trend in the electronics industry toward greater miniaturization of semiconductor devices and toward the integration of a greater number of circuit elements into such semiconductor devices has been supported by the development of highly sophisticated manufacturing equipment. Circuit elements having features with a line width of two microns ($2 \times 10^{-6}$ meters) or even less are now the state of the art.

Photolithographic apparatus such as non-contact projection printers feature a degree in optical precision which allows images of pattern features to be projected from photomasks onto photosensitized semiconductor substrates with a high degree of resolution. The precise resolution or sharpness of the projected images is accompanied by a depth of focus which is substantially reduced to a range of about 10 microns about a focal plane along the projection axis of a typical, state-of-the-art projection printer. In addition to such focal depth limitations, other problems are encountered in imaging processes using even the most up-to-date equipment. For example, such disadvantageous technical phenomenon as arcing between adjacent lines tends to destroy unprotected photomasks and a commercially self-limiting factor appears in a demand for relatively smaller quantities of the relatively more specialized circuit devices with a greater degree of integration.

To support a new flexibility in the market introduction of newly developed devices through a recently advanced technology of computer-aided circuit design, photomasks for low-volume, specialized circuit devices are used in projection printers interchangeably with photomasks for devices which are expected to see higher volume, long-term markets. While photomasks for low-volume orders are typically used without first becoming protected against accidental damage, the photomasks for a large volume product are advantageously protected, for example, by coverplates, before they go into use.

The use of coverplates in the protection of photomasks is known to offer advantages over other forms of protection, such as the use of protective films or pellicles. However, protecting photomasks with coverplates is also known to shift the image plane of the photomask pattern away from the plane of the photomask pattern. When photomasks are protected by typical pellicles, such a shift of the image plane away from the image plane of an unprotected photomask does not occur.

The referred-to shift in the image plane of a coverplate-protected photomask with respect to an unprotected photomask has been found to present production problems when production schedules require a product mix of devices formed from unprotected photomasks as well as coverplate-protected photomasks. Mounting surfaces which locate the photomasks in projection printers with respect to mounting surfaces for locating photosensitized surfaces of semiconductor wafers need to be adjusted with respect to each other each time a change is made between unprotected photomasks and those protected by coverplates.

A trained technician is capable of performing a readjustment of the photomask mounting surfaces of currently available projection printers into a different focal plane within a period of approximately four hours. A similar length of time is then required to return the adjustment of the mounting surfaces for the photomasks to accommodate the coverplate-protected production photomasks. As a result, typically a full workday of photolithographic production is lost in adjustment time alone, whenever the production requires that product defined on unprotected photomasks is interposed between runs of coverplate-protected photomasks. When coverplate-protected photomasks are accommodated by one or more projection printers which remain adjusted to accommodate the coverplate-protected photomasks, such dedicated projection printers eliminate time losses due to the referred-to adjustments to accommodate focal shifts. However, dedicating projection printers entirely to processing from particular photomask structures becomes inefficient when the projection printers become under-utilized because of the special fixed focus setting.

SUMMARY OF THE INVENTION

The present invention overcomes various drawbacks and inefficiencies which exist in prior art procedures. In accordance with the present invention, a photomask for use in a projection printer includes a substrate having a pattern of object features thereon, and a coverplate positioned over the pattern, such coverplate having a first predetermined thickness of a material with an index of refraction greater than unity to cause a shift of a predetermined distance in an object plane along an optical path of a projection printer into which the photomask is inserted. The photomask further includes mounting surfaces to allow the photomask to be mounted against corresponding support surfaces of a mounting chuck in the projection printer. The mounting surfaces are located in a plane parallel to and offset from the plane of the pattern by a distance equal to the predetermined distance by which the object plane is shifted because of the presence of the coverplate in the optical path of the projection printer.

A method, in accordance with the invention, of projecting images onto photosensitized workpiece surfaces, employs coverplate-protected photomasks and involves spacing patterns away from support surfaces of a mounting chuck by a distance which is equal to a shift in an object plane due to the introduction of such coverplates into an optical projection path.

BRIEF DESCRIPTION OF THE DRAWING

Various features and advantages of the invention may be best understood when the following detailed description of an embodiment of the invention is read in reference to the appended drawing, wherein.

DETAILED DESCRIPTION

Figure 1:
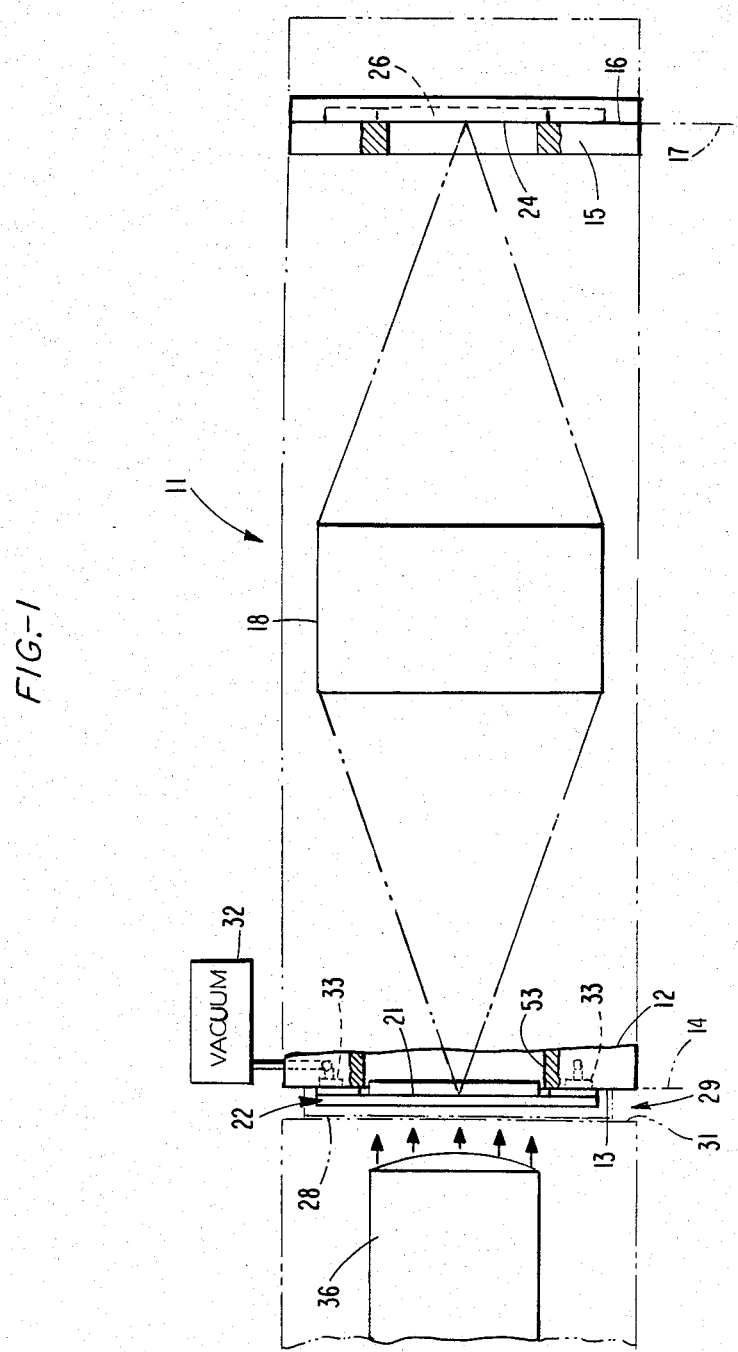
FIG. 1 is a schematic representation of a projection printer for reproducing, for example, electronic device features which are patterned on a photomask on a photosensitized surface of a semiconductor wafer.

Referring now to FIG. 1, there is shown a schematic representation of an apparatus, designated generally by the numeral 11, which is commonly known as a projection printer. Projection printers are commercially available, for example, from the Perkin-Elmer Corporation. Such state-of-the-art projection printers which have become production tools in semiconductor manufacturing processes achieve a resolution sufficient to resolve a projected image having line width features in the order of 2 microns ($2 \times 10^{-6}$ meters) or even smaller.

Operational elements of a typical state-of-the-art projection printer represented by the apparatus 11 in FIG. 1 feature a photomask vacuum mounting chuck 12 having a support surface 13 in an object plane 14 and a workpiece holder 15 having an appropriate workpiece support surface 16 in an image plane 17. The terms "object plane 14" and "image plane 17" are used herein to refer, respectively, to the plane 14 in the apparatus 11 at which an object is placed such that imaging optics 18 of the apparatus 11 form an image of such object in the plane 17. The imaging optics 18, which are schematically shown, may be reflective, refractive or may include a combination of reflective and refractive optical projection elements. The physical arrangement or structure of a typical commercial optical apparatus 11 is not directly related to the invention. Also the terms "optics" and "optical" are used herein with their physical meaning and relate to electromagnetic energy which may be visible or of a frequency outside of the visible spectrum. Thus it is understood that an image of a pattern 21 of features on a photomask 22 is projectable to a photosensitized surface 24 of a workpiece 26, such as a semiconductor wafer by any particular wavelength of energy which may be employed in the apparatus 11. Furthermore, the photosensitivity of the surface 24 is capable of being activated by such employed wavelength or wavelengths of energy.

FIG. 1 generally highlights the functional interrelationship of the component elements of the apparatus 11. The photomask 22 is placed into a mounting frame 28 which is depicted in phantom lines. The frame 28 is inserted into a port 29 of the apparatus 11, from where it slides along guides 31 into position adjacent to the mounting chuck 12. When a vacuum retaining system 32 is activated, vacuum cavities 33 draw the photomask against the support surface 13 of the chuck 12. A semiconductor wafer 26 is similarly loaded into the apparatus 11.

A light source 36 is then typically activated to project the patterns 21 (please refer to FIGS. 2 and 3 for an enlarged representation of the patterns) of the photomask 22 resolved through the imaging optics 18 onto the photosensitized surface of the semiconductor wafer 26. Desirably, the apparatus 11 is used with both a photomask 22 of a type the patterns of which are protected by a coverplate 39, and a photomask of a type the patterns of which are either unprotected or protected by pellicles (not shown).

Figure 2:
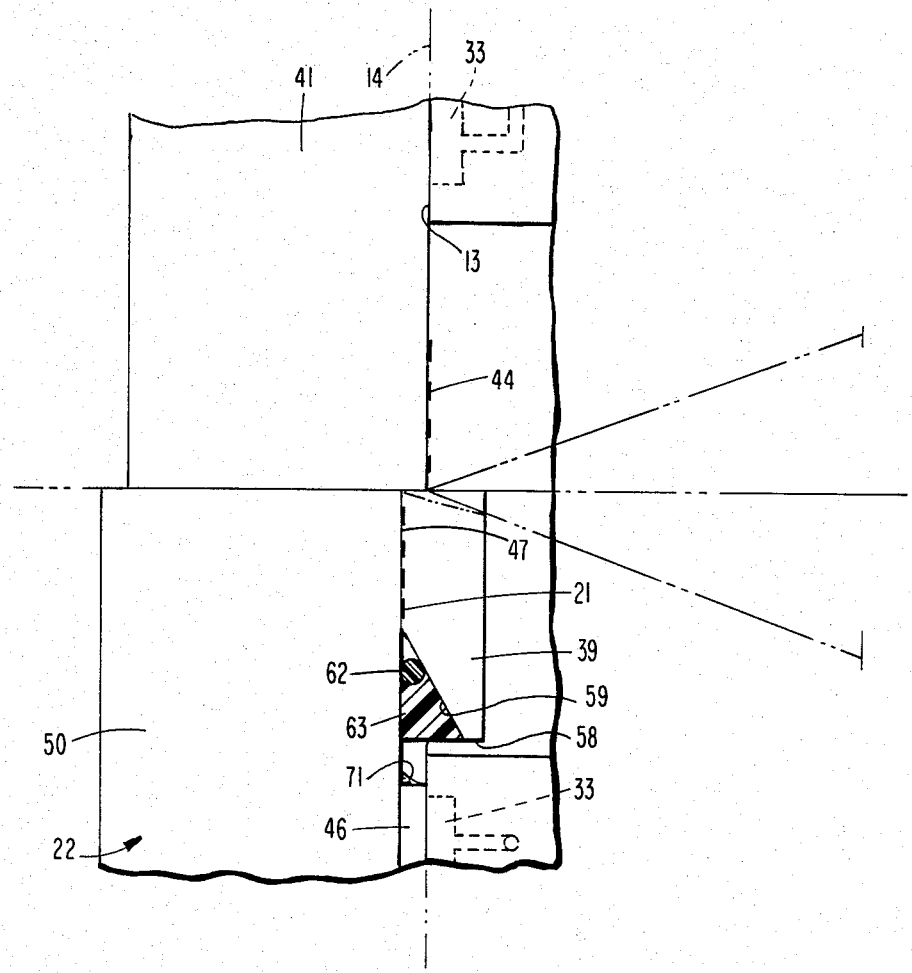
FIG. 2 shows a split-image type schematic side view for a comparison between an unprotected photomask and of a coverplate-protected photomask including focal plane adjusting spacers as a particular feature of the invention.

FIG. 2 shows for purposes of illustration a split image-type of comparison between an unprotected photomask 41 and the photomask 22 which is protected by the coverplate 39 in accordance with the invention. The support surface 13 of the chuck 12 is coincident with the object plane 14. Consequently, when the unprotected photomask 41 is loaded into the apparatus 11, patterns 44 on the unprotected photomask 41 coincide with the object plane 14 of the projection printer 11 and an image of the patterns 44 is projected onto the adjacent surface of the wafer 26.

In contrast to the simple optical structure of the unprotected photomask 41, the coverplate 39, which has an index of refraction greater than unity, shifts the true object plane of the patterns 21 on the photomask 22 away from the plane of the support surface 13 of the chuck 12. Even though the coverplate 39 is optically a simple element, namely a transparent plate having two parallel, plane surfaces, the introduction of the coverplate 39 into the optical path of the projection printer 11 nevertheless has the effect of shifting the object plane 14 away from the image plane. To control the distance through which the object plane is shifted, the coverplate 39 has a predetermined thickness.

To furthermore overcome a need for adjusting the position of the chuck 12 each time the operation of the apparatus 11 switches from an unprotected photomask 41 to a coverplate protected photomask 22, the photomask 22 features shims 46 which space a patterned surface 47 of the photomask 22 away from the support surface 13 of the chuck 12. The shims 46 are precision lapped to a thickness which equals the distance through which the focus plane of the patterns is shifted out of the object plane 14 as a result of the presence of the coverplate 39 on the patterned surface 47. The structure of the photomask 22 including the combination of the coverplate 39 and the shims 46 consequently is an optical equivalent to the unprotected photomask 41 in that it appears to have its pattern 21 located in the same focal plane with respect to its mounting position against the reference surfaces of the mounting chuck as the unprotected photomask 41. Both the unprotected photomask 41 and the coverplate protected photomask 22 can be drawn against the support surface 13 of the chuck 14 by vacuum applied to the cavities 33.

Figure 3:
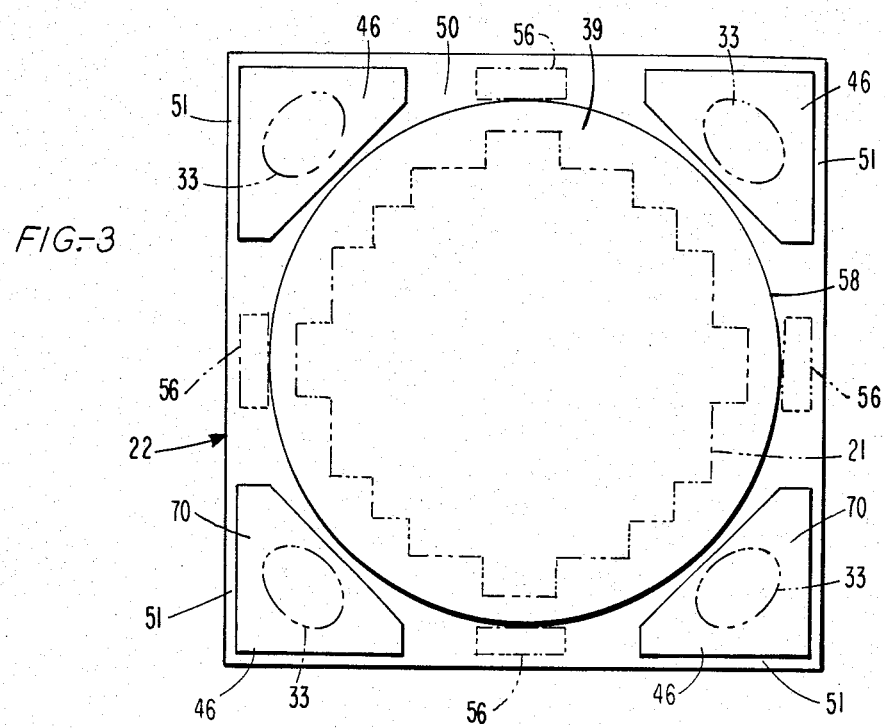
FIG. 3 is a top view of a photomask showing a coverplate and spacer regions as a preferred embodiment of the invention.

In FIG. 3, a plan view of the photomask 22 shows a particular arrangement of a circular coverplate 39 and shims 46 on a patterned substrate 50 of a photomask 22. A preferred number of four of the shims 46 corresponding to the structural arrangement of the corresponding support surfaces 13 are located in four respective corner regions 51 of the photomask substrate 50. As illustrated, a preferred configuration of the coverplate 39 has the shape of a circular disk. The size of the disk is substantially the same as the size of the wafer 26 to accommodate a typical one-to-one projection printing process wherein the coverplate 39 actually extends into a throat 53 (see FIG. 1), i.e., a central optical opening, in the mounting chuck 12.

Referring back to FIG. 3, the size of the shims 46 is marginally larger than the corresponding size of the adjacent vacuum cavities 33, such that the outer surfaces of the shims fully cover the vacuum cavities 33 when the photomask 22 is loaded into the apparatus 11. An optimum size of the coverplate 39 extends past the outer periphery of permissible pattern sites of the pattern 21 (shown in broken lines). At the same time, the size of the coverplate 39 is limited to a size no larger than the already referred to opening of the throat in the mounting chuck. Also, the coverplate may not extend into interfering relationship with mounting areas for the shims 46.

Procedures for applying the coverplates in accordance with the prior art are described in U.S. Pat. No. 4,361,643 to E. L. Banks et al. Of the methods of applying the coverplates, the application of an index matching fluid (not separately identified) to the substrate 50, followed by placing a coverplate 46 over the index matching fluid, is preferred. A function of the index matching fluid is to produce optical continuity between the substrate 50 and the coverplate 39. Thus when the coverplate is properly assembled to the substrate 50, the fluid eliminates optical interference at the interface between the substrate 50 and the coverplate 39, such that the coverplate remains optically transparent. Optically, the substrate 50 and the coverplate 39 become a unitary structure wherein the pattern 21 of object features appears to be suspended. In applying the circular coverplate 39 to the substrate 50, temporary positioning blocks 56, preferably of a material such as copper or brass, are placed on the surface of the substrate 50, as shown in phantom lines in FIG. 3. The blocks 56 locate the coverplate 39, after it has been placed over the index matching fluid in a pivoting motion, to minimize or totally avoid any entrapment of air under the coverplate.

After the coverplate 39 is placed over the index matching fluid, the fluid being a typical mineral oil known in the art for such purpose, the substrate 50 and the coverplate 39, restrained from relative lateral movement by the temporary positioning blocks 56, are placed on a typical hot plate (not shown). According to the preferred assembly method, the substrate 50 and the coverplate 39 are maintained on the hot plate at a temperature within a range of 180° to 200° C. for a period of approximately 12 hours. During such time dispersed residual gases combine into bubbles which migrate and diffuse outward and out of the index matching fluid at the interface between the fluid and the atmosphere along the periphery of the coverplate 39. At the conclusion of such out-gassing step, the coverplate 39 becomes mounted to the substrate 50.

Figure 4:
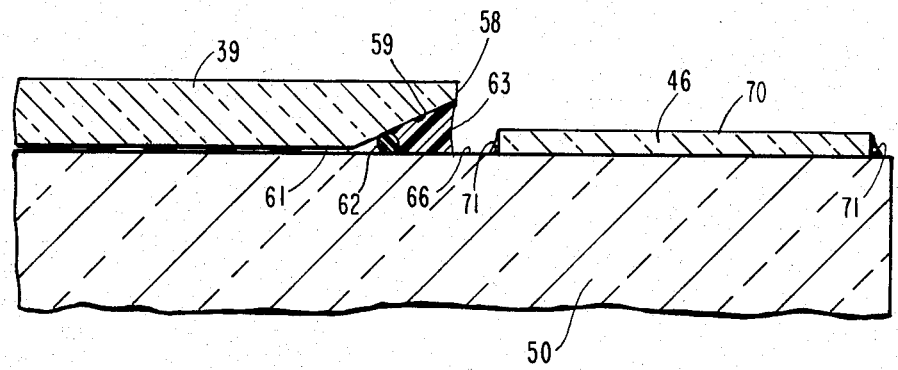
FIG. 4 is an enlarged sectional view of a portion of the photomask showing particular structural features of a coverplate-protected photomask.

FIG. 4 shows a greatly enlarged partial section of the coverplate 39 in its mounted position on the substrate 50 and adjacent to one of the shims 46. An edge 58 of the coverplate 39 shows a bevel 59 on an underside 61 of the coverplate 39, such that the bevel 59 forms a "V" groove with the substrate 50 along the edge 58 of the coverplate. A preferred taper of the "V" groove is such that the bevel 59 forms a 26° angle with the adjacent surface of the substrate 50. After the described out-gassing step is completed, a polymer gasket 62 is placed around the periphery of the coverplate into the base of the "V" groove and the coverplate 39 is tack-bonded, preferably at four substantially equally spaced peripheral spots with an epoxy-type bonding material, such as shown as a fillet 63.

After the bonding material has polymerized, the temporary positioning blocks which supported the coverplate 39 up to that point are removed, and peripheral areas about the coverplate 39 are cleaned of any excess of the index matching fluid. The fillet 63 of epoxy-type bonding material is then applied in a continuous bead at the edge 58 of the coverplate 39 to fill the "V" groove entirely. When the bonding material is applied adjacent to the "V" groove, capillary attraction apparently draws the bonding material into the "V" groove and surface tension draws the outer surface of the epoxy-type filler material inward toward the "V" type space to form the fillet 63 within the vertical confines of the coverplate 39 as seen in the enlarged section of FIG. 4. As a result, the bonding material is substantially confined to the space within the vertical projection of the coverplate 39. After curing the epoxy fillet 63, a second, optional sealing coating 65 of epoxy or lacquer may be applied about the periphery of the coverplate 39.

A added advantage which is believed to be based on a small amount of shrinkage typically associated with epoxy-type polymeric bonding materials has been noticed. As the epoxy polymerizes, it attaches itself to the contacted surface 66 of the substrate 50 and to the contacted surface of the bevel 59. During the ensuing shrinkage as the epoxy becomes fully cured, the surface of the bevel 59 becomes drawn toward the adjacent surface portion 66 of the substrate 50. The epoxy bonding material consequently draws the edge of the coverplate 39 toward the substrate 50 in a peripheral seal wherein the adjacent, substantially opposite surface portions of the "V" groove provide a substantial surface area over which the forces of the bond become distributed.

The sealing action of the applied epoxy bonding material also interacts with the gasket 62. The function of the gasket 62 in the assembly is to stop capillary attraction from drawing the bonding material past the gasket 62 into the "V" groove and into the capillary space between the substrate 50 and the coverplate 39. In such space, the epoxy would tend to optically interfere with the projection of the pattern. It has been found that the capillary forces tend to readily draw the bonding material into the narrowmost gaps between the gasket 62 and the surface 66 of the substrate 50 or the bevel 59. But once the bonding material is drawn past the narrowmost gaps between the respective surfaces, the capillary forces appear to balance, and further advance of the bonding material into the "V" groove is arrested. The gasket 62 consequently becomes an effective interface between the index matching fluid and the bonding material. The gasket 62 in the preferred embodiment is a nylon monofilament cord having a diameter of approximately 175 microns.

After the coverplate 39 has become sealed to the substrate 50, the surface of substrate 50 about the coverplate is thoroughly cleaned with a degreasing detergent and with alcohol. Thereafter, the shims 46 are applied to the corner regions 51 of the substrate 50. In a preferred structure of the photomask 22, the shims 46 and the coverplate 39 are of the same type of material as the substrate 50 to reduce thermal expansion stresses. The shims 46, the substrate 50 and the coverplate 39 advantageously are of a low expansion-type borosilicate based glass which is known in the trade, and which is commercially available from Hoya Corporation under the trade designation LE-30 glass. Prior to being applied to the substrate 50, the shims 46 are lapped and polished to a precise thickness equal to the shift in the object plane due to the introduction of the coverplate 39. The thickness of the coverplate 39 in the preferred embodiment is 0.040 inch or 1,016 microns. The focal shift which needs to be compensated for is governed by the physical relationship $$f = t(1 - 1/n)$$

where f is the amount of the shift of the focus due to the application of a coverplate of the thickness "t" of a material having a refractive index "n". The refractive index of the LE-30 glass is known to be 1.546. The thickness of the shims 46 is, consequently, a nominal 0.0141 inch or 360 microns.

It has been found that when the shims 46 are lapped and polished to the proper thickness such that the surfaces of the shims are free of foreign particles, molecular bonding takes place between the lapped and polished glass surfaces upon mutual contact. Consequently, the shims 46 must be stored separate from each other. In mounting the shims 46 to the corner regions of the substrate 50 after the regions have been cleaned, it is merely necessary to place the shims 46 into contact with the surface of the substrate 50 and apply slight pressure to an outer mounting surface 70 of the shims. The shims 46 become readily attached to the substrate 50 without the need for any intervening layer of adhesive. Consequently, the thickness of the shims 46, as established by the prior lapping and polishing steps, determines the precise shift in the object plane of the photomask 22.

However, to assure the continued adhesion during normal use of the shims 46 to the substrate 50, a peripheral bead of lacquer 71 is applied to the shims 46 as shown in FIG. 4. The preferred lacquer is a typical, commercially available clear lacquer. The lacquer is preferred over epoxy-type bonding materials because of its low viscosity. By using a low viscosity lacquer as a bonding agent, the risk of an inadvertent build-up of the material above the outer mounting surfaces 70 of the shims 46 is substantially eliminated.

It is emphasized that the ability of adhering the shims 46 by molecular bonding, and consequently without any intervening layer of bonding material between the shims 46 and the substrate 50, is a major factor in the feasibility of attaching the shims 46 to effectuate the precisely calculated shift in the object plane. It has been found that the thicknesses of intervening layers of bonding material are not readily controlled in typical manufacturing environments to such precision as would assure the parallelism of the patterns on the photomasks 22 to the object plane in the projection printer 11. The thickness of the shims 46 lapped and polished to virtually no discernible variation in thickness between the shims, assures the parallelism and coincident alignment of the patterns with the object plane. The parallelism of the two major surfaces of the coverplate 39 itself becomes less critical in the described embodiment since the coverplate 39 is not used to establish the orientation of the plane of the patterns with respect to the object plane of the projection printer 11.

In operating the apparatus, e.g., the projection printer 11, with a product mix of coverplate protected and unprotected photomasks, a first one of the photomasks 22 is inserted into the projection printer in the described manner, and a first series of semiconductor wafers 26, referred to as a lot, are exposed. A subsequent lot of wafers 26, may, for example, be one for devices of a short production run or for experimental devices, the photomasks for which have not been protected with coverplates. It is, nevertheless, possible to substitute for the previously used photomask 22 a respective one of the unprotected photomasks 41 without making any adjustment at the projection printer 11 to shift the location of the mounting surface of the chuck 12 with respect to the image focal plane at which the wafers are located.

It is to be realized that the described embodiment of the invention serves to illustrate features and advantages of the invention. Its specific applicability to photolithographic steps in the production of semiconductor devices is a current application of the invention. However, to the extent that photomasks find application in various other photolithographic reproduction processes, the presently described photomask 22 is but one example of the present invention. For example, the shape of the structure of the photomask 22 shown in the plan view of FIG. 3 is adapted to fit a projection printer which is currently used in photolithographic projection processes in the semiconductor industry. It is seen that, in another embodiment, the substrate 50 could be of circular shape and the coverplate 39 could be in the shape of a square such that in the application of the coverplate to the substrate, four segmental regions of the substrate would remain exposed for the shims 46 to be applied. In another embodiment, both the substrate 50 and the coverplate 39 could be of circular shape or the coverplate could be in a preferred shape of a triangle, all these variations in the shape of the structure being made within the spirit and scope of the invention.

Other changes and modifications within the scope of the invention relate to substitutions in the materials of the masks. Instead of a referred-to low-expansion type glass, such as the LE-30 glass, quartz may be preferred for permanent, coverplate-protected photomasks. Quartz, a silicon oxide, is more costly than other glass-type materials of optical quality. However, in a high volume production facility, temperature stability and commercial availability factors may outweigh initial cost considerations. In case of a change to a particular material, the use of like materials for the substrate 50, the coverplate 39 and the shims 46 is preferred.

A change of material in the photomask 22 from a low expansion type glass to quartz brings about associated changes in the predetermined thickness of the shims 46, even though the structure of the photomask 22 may not differ in other respects from the photomask 22 described herein. For example, the index of refraction of quartz, at the preferred wave length of 4,360 Angstroms, is 1.467. The resulting thickness of the shims 46 is 0.0128 inch instead of the 0.0141 inch thickness of the shims 46 of low expansion type glass. The above are typical examples of changes and modifications which are possible within the spirit and scope of this invention.

What is claimed is:

1. A photomask for use in a projection printer, comprising:
   a substrate having a major surface in a plane and a pattern of projectable object features on such surface;
   a transparent coverplate positioned over the pattern and attached to the substrate, such coverplate having a predetermined thickness and an index of refraction greater than unity, thereby causing a shift by a predetermined distance of an object plane along an optical path of such projection printer upon insertion of the photomask therein; and
   mounting surfaces disposed on the substrate in regions of the substrate adjacent to support surfaces of a mounting chuck in the projection printer upon insertion of the photomask into the projection printer, such mounting surfaces being located in a plane parallel to, and offset from, the plane of the pattern by a distance equal to the predetermined distance by which the object plane is shifted due to a presence of the coverplate in the optical path of the projection printer.

2. A photomask according to claim 1:
wherein the substrate is of rectangular shape, and the pattern of object features is substantially centered on the major surface of the substrate;
wherein the coverplate is of circular shape and is centered over the pattern; and
wherein the mounting surfaces are four mounting surfaces which are peripherally disposed about the coverplate in four corner regions of the substrate to become aligned with four corresponding support surfaces of said mounting chuck.

3. A photomask according to claim 2, wherein the four mounting surfaces are outer surfaces of shims having a predetermined thickness equal to the distance by which the object plane of the projection printer is shifted due to the presence of the coverplate in the optical path of the projection printer, and the shims are attached to the substrate by direct contact with said major surface of the substrate.

4. A photomask according to claim 3, which further comprises a peripheral bead of bonding material located about the edge of each of the shims and sealing the edge of such respective shim to said major surface of the substrate.

5. A photomask according to claim 4, wherein the substrate, the coverplate and the shims are of the same material.

6. A photomask according to claim 5, wherein the material of the substrate, the coverplate and the shims is a thermally stabilized glass.

7. A photomask according to claim 5, wherein the material of the substrate, the coverplate and the shims is quartz.

8. A photomask according to claim 4, wherein the edge of the coverplate is beveled toward said major surface of the substrate and the coverplate is attached to the major surface of the substrate by a bonding material which occupies a "V"-groove formed between a beveled surface along the edge of the coverplate and the adjacent portion of said major surface of the substrate.

9. A photomask according to claim 8, wherein a sealing gasket is located in the base of the "V"-groove, said sealing gasket being an interface between the bonding material and a narrow space between adjacent surfaces of the substrate and the coverplate.

10. A method of projecting onto an image receiving surface, images of patterns of object features formed on a surface of a substrate of a photomask and protected by a coverplate having a predetermined thickness and a predetermined index of refraction greater than unity, which comprises:
locating said image receiving surface in an image plane;
aligning said photomask with support surfaces of a mounting chuck located in an object plane relative to said image plane such that the coverplate faces toward the image plane; and
spacing said surface of the substrate of the photomask carrying said pattern of object features away from the object plane by a predetermined distance which is equal to a distance by which the object plane becomes shifted away from the support surfaces of the mounting chuck as a result of aligning said photomask with the support surfaces such that the coverplate faces toward the image plane.

11. A method of projecting patterns onto an image receiving surface according to claim 10, wherein the substrate of the photomask and the coverplate are of a material which is optically transparent to light energy and the image receiving surface is photosensitized, the method comprising:
projecting light energy through the substrate past the patterns and through the coverplate toward photo-imaging optics; and
resolving an image of the pattern on the photosensitized image receiving surface to the same degree as if the patterns had been located in a plane of the mounting surfaces in the absence of the coverplate.

* * * * *